United States Patent
Oguchi et al.

[11] 4,035,674
[45] July 12, 1977

[54] QUARTZ CRYSTAL VIBRATOR

[75] Inventors: Kikuo Oguchi; Ogata Toshiaki; Eishi Momosaki, all of Suwa, Japan

[73] Assignee: Kabushiki Kaisha Suwa Seikosha, Tokyo, Japan

[21] Appl. No.: 629,951

[22] Filed: Nov. 7, 1975

[30] Foreign Application Priority Data

Nov. 9, 1974    Japan .................. 49-129111

[51] Int. Cl.² .................................. H01L 41/04
[52] U.S. Cl. .......................... 310/9.5; 310/9.6; 310/9.7
[58] Field of Search ............ 310/9.5, 9.6, 8.2, 9.7

[56] References Cited

U.S. PATENT DOCUMENTS

| | | | |
|---|---|---|---|
| 2,677,064 | 4/1954 | Hill | 310/9.5 X |
| 2,743,144 | 4/1956 | Bottom et al. | 310/9.5 |
| 3,072,806 | 1/1963 | Sogn | 310/9.5 |
| 3,585,418 | 6/1971 | Koneval | 310/9.6 X |
| 3,617,780 | 11/1971 | Benjaminson et al. | 310/9.5 |
| 3,824,352 | 7/1974 | Adler et al. | 310/9.5 X |

OTHER PUBLICATIONS

Handbook of Piezoelectric Crystals by Buchanan, WADC Technical Report, 54-248, Dec. 1954, pp. 34-45.

*Primary Examiner*—Mark O. Budd
*Attorney, Agent, or Firm*—Blum, Moscovitz, Friedman & Kaplan

[57] ABSTRACT

Quartz crystal vibrators of small size which vibrate in the shear mode consist essentially of a vibrating portion and a support portion, both of which lie in the same plane. As a consequence, they are readily manufactured on a production basis and can be shaped so as to minimize the effect of variation in ambient temperature.

6 Claims, 6 Drawing Figures

QUARTZ CRYSTAL VIBRATOR

BACKGROUND OF THE INVENTION

Quartz crystal wristwatches utilizing flexure-mode quartz crystal vibrators are now in wide use. Such wristwatches are far superior in accuracy to wristwatches employing earlier methods of construction and control. One reason why the flexure-mode vibrators have been utilized is that they have a relatively low resonance frequency which can be adjusted to a specific value. However, the resonance frequency of flexure-mode quartz crystal vibrators varies substantially with ambient temperature, in which respect they are inferior to shear-mode quartz crystal vibrators. Although the electronic circuits suitable for the higher frequency of the shear-mode quartz crystal vibrators are now available, such quartz crystal vibrators have not as yet come into use because it has not been possible to manufacture them in the requisite small size at the low price necessary. It would therefore be highly desirable to develop manufacturing techniques suitable for large scale production which can yield shear-mode quartz crystal vibrators of high reliability at low cost.

SUMMARY OF THE INVENTION

A thin Y-cut plate, rotated about the X-axis by 50° to 60° is cut from a quartz crystal. The Y-cut plate is lapped and polished sufficiently to remove the distortion caused during the cutting process and to bring the plate to the requisite thickness. A metallic film is deposited on the front and back surfaces of the plate. The metallic films are removed in a desired pattern by photo-etching, the pattern being such as to correspond to the eventual shape of the quartz crystal vibrators. The quartz crystal plate is then etched away in the areas not covered by the metallic film. The pattern is preferably such that a plurality of vibrators may be made from a single plate simultaneously. The metal films serve as electrode films and electrodes are attached to the front and rear of each vibrator. The vibrator may be enclosed in a housing if desired, and the shape is such that the entire assembly is small.

The vibrator may be cut with opposed edges which are straight and which vibrate in the shear mode. If desired, the opposed edges which vibrate in the shear mode may be appropriately curved to minimize the effect of variation in the ambient temperature.

Accordingly, an object of the present invention is a quartz crystal vibrator which operates in the shear mode and which can be manufactured reliably on a large scale at low cost.

Another object of the present invention is a quartz crystal vibrator which operates in the shear mode and which can be shaped to minimize the effect of variation in ambient temperature.

An important object of the present invention is a quartz crystal vibrator which operates in the shear mode and which is suitable for use in wristwatches.

A significant object of the present invention is a process for the manufacture of thin quartz crystals which vibrate in the shear mode and which is suitable for manufacture on a large scale at low cost.

Yet another object of the present invention is a process for the manufacture of quartz crystal vibrators which operate in the shear mode in which a plurality of vibrators can be obtained by cutting a single quartz plate in a predetermined pattern.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
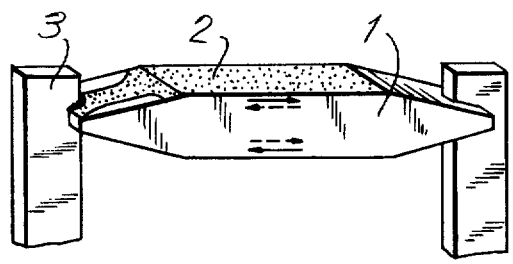
FIG. 1 is a shear-mode quartz crystal vibrator in accordance with the prior art.

A conventional shear-mode quartz crystal vibrator of small size is shown in FIG. 1. The vibrator itself has the reference numeral 1. An electrode 2 is deposited on the surface of the vibrator 1. The vibrator is mounted in holders 3 which also serve as leads. The mode of vibration of the vibrator is indicated by the arrows and, as can be seen, is of the thickness-shear vibration type. The temperature-resonance frequency characteristic of this type of quartz crystal vibrator has the shape of a cubic curve which is an excellent characteristic. Moreover, as can be seen from the Figure, the overall size of the vibrator is quite small. However, to manufacture such a vibrator from natural quartz crystal and retain the excellent electrical characteristics is quite difficult. A principal difficulty is the fact that the shaping process causes distortion in the vibrator as a result of which the use of a diamond cutter is not feasible. Instead, the shaping of the vibrator requires the use of lapping in order to obtain a suitable aging characteristic with respect to both resonance frequency and the Q valve. Such lapping is quite difficult because there are eight plane surfaces which must be lapped, and even if opposing surfaces are lapped in pairs, then four separate operation are involved. This multiplicity of lapping operations increases the cost of the vibrators unacceptably. Moreover, the accuracy with which the resonance frequency can be established is poor due to the large number of steps involved so that adjustment of the vibrator to obtain the desired resonance frequency becomes necessary.

Figure 2:
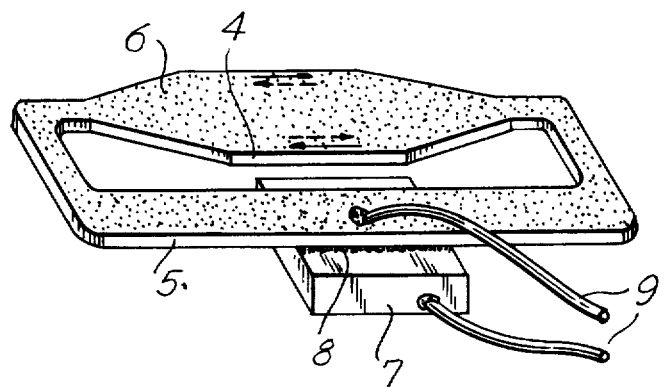
FIG. 2 is a shear-mode quartz crystal vibrator in accordance with the present invention, the opposed edges which vibrate in the shear mode being straight.

These difficulties are eliminated in the vibrator of the present invention, the design of which is such that a much simpler and less costly manufacturing process can be employed. The vibrator in accordance with the present invention is shown in FIG. 2. As can be seen, it is planar in shape and has a vibrating portion 4 and a support portion 5. It is covered on both faces with metallic films 6 which serve as electrodes. The vibrator is secured to a block 7 by means of solder 8 joined to the metallic film on the lower surface of the vibrator. Lead wires 9 make electrical contact contact with the upper and lower surfaces of the vibrator and the vibrator is set into shear vibration as shown by the arrows in FIG. 2 when the vibrator is excited by applying a voltage across the leads 9. It will be noted that the edges which vibrate in opposite directions are straight in the device in the form shown in FIG. 2.

Figure 3:
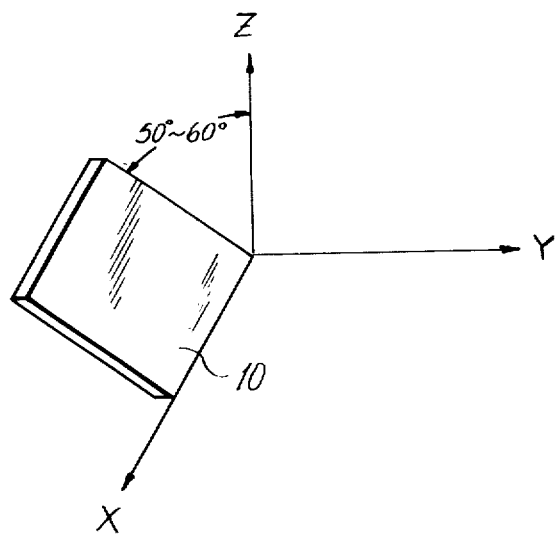
FIG. 3 shows diagrammatically the orientation of the Y-cut plate with respect to the axes of quartz crystal from which it is cut.

In cutting a quartz crystal vibrator plate in accordance with the present invention from a natural quartz crystal, the X, Y and Z axes are identified, these being respectively the electrical, mechanical and optical axes of the quartz crystal. The orientation of the Y-cut plate cut from the natural crystal is shown in FIG. 3, and, as can be seen in said Figure, can be described as being arrived at by rotation around the X axis through an angle of 50° – 60° from the XZ plane. After cutting the plate from the natural quartz crystal (not shown) it is necessary to remove the distortion caused during the cutting process. This is accomplished by lapping and polishing the surfaces of the crystal to the extent necessary to substantially eliminate such distortion. In the process, if desired, the thickness of the plate can also be adjusted.

Figure 4:
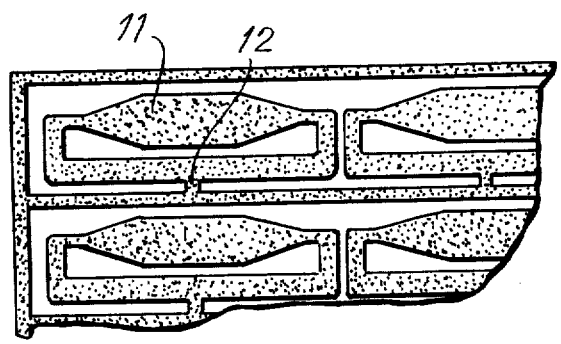
FIG. 4 is an appropriate pattern for the preparation of a plurality of vibrators from a single plate.

To prepare shear-mode vibrators from the plate, one or more metallic films are laid down upon each of the planar surfaces of the plate. Preferred metallic films are chromium as a base with gold thereon. The metallic films are partly removed as by photo-etching to achieve the shape 11 as shown in FIG. 4, the shape 11 being that of the final quartz crystal vibrator. After the metal is removed by photo-etching, the exposed area of the plate is dissolved away, a preferred reagent being a mixed solution of hydrofluoric acid and ammonium fluoride. As is evident from FIG. 4, a plurality of quartz crystal vibrators can be produced from a single plate. The individual vibrators can be separated from each other by incorporation of a weak section 12 in the structure. The vibrator can be separated from the remainder of the structure as by breaking the vibrator out or by dissolving away the quartz under a scribed line using a reagent as described above. It should be noted that the metallic films of inert metal, and particularly chromium and gold, when shaped, as by photo-etching, serve as protection masks during dissolution of the quartz crystal and in addition, serve as electrode films to which leads can be joined. Also, the shape of the electrodes and of the vibrator itself is established by the shape of the electrode film.

As is evident, the shear-mode quartz crystal vibrator manufactured in accordance with the present invention involves simple steps which are amenable to mass production methods so that large numbers of such vibrators can be made at low cost. Using the photo-etching technique, the following advantages are achieved:

1. The external form of the vibrator can be virtually anything desired, and the size of the unit can be made very small.
2. The shape of the vibrator can be held to design specification with great accuracy and the frequency of vibration can be adjusted easily so that there is a substantial reduction in the manufacturing cost.
3. The highly reproducable form of the vibrator facilitates automatic installation thereof.
4. A plurality of vibrators can be produced from a sheet of quartz with sufficient precision so that all of the vibrators have similar characteristics.

Figure 5:
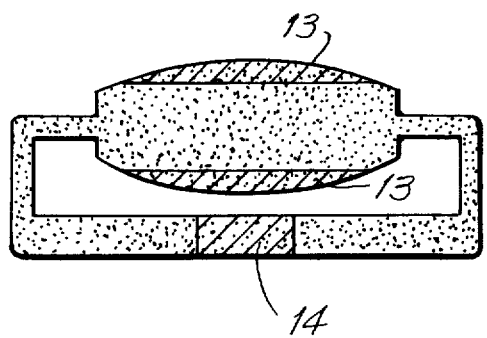
FIG. 5 is a shear-mode quartz crystal vibrator in accordance with the present invention wherein the opposed vibrating edges are shaped to minimize the effect of ambient temperature.

As an example of the way in which the shape of the vibrator can be modified in accordance with design objectives, the embodiment of FIG. 5 differs from that in FIG. 2 in that the former has convex edges which vibrate. Due to the method of manufacture, there is no difficulty involved in making the edges of any desired shape. Consequently, the vibrating portion can readily be made wider at the central part thereof; a vibrator of such convex shape vibrates in what is called the trapped-energy mode. A second difference betwen the vibrator of FIG. 5 and that of FIG. 2 is that the vibrator of FIG. 5 has relatively thick metallic deposits at 13.

The thickness is controlled for the purpose of adjusting the resonance frequency. A convenient method of adjusting the resonance frequency with great precision is the irradiation of the metallic portions 13 by means of a laser beam to melt and vaporize the necessary quantity of metal.

Another modification of the vibrator shown in FIG. 5 is the use of a relatively heavy deposit of metal in the region 14 which is part of the support portion. The use of the relatively heavy deposit at 14 facilitates bonding of the leads to the device. Naturally, soldering is a preferred method of bonding the leads.

Figure 6:
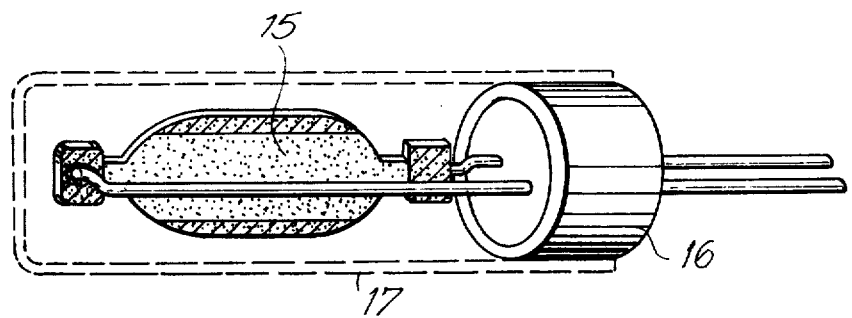
FIG. 6 is a perspective view showing how a quartz crystal vibrator in accordance with the present invention can be mounted in a housing to occupy a minimum space.

Another embodiment of the invention is shown in FIG. 6. The quartz crystal vibrator has two separate support portions at the ends thereof. Conveniently, the metal deposits at the ends are heavier than over the body of the vibrator itself. This facilitates attachments of two lead wires which serve as supports, the lead wires penetrating plug 16. A cap 17 indicated by the dashed lines may then be sealed to plug 16 to provide a hermetically seal quartz crystal vibrator. The interior of the device may be either evacuated or filled with inert gas. The shape of the vibrator is such that the entire structure can be made in very small size and with but little waste space.

Vibrators of the types shown herein have been found to be of great utility in wristwatches as well as in other types of instruments due to the fact that they are light in weight, small in size, low in cost and can readily be manufactured to vibrate at a selected frequency with high precision, the resonance frequency being relatively impervious to the effect of variation in ambient temperature.

It will thus be seen that the objects set forth above, among those made apparent from the preceding description, are efficiently attained and, since certain changes may be made in carrying out the above process and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An essentially planar shear-mode quartz crystal vibrator, said vibrator being a Y-cut vibrator, the plane of said vibrator being rotated around the X-axis by 50° – 60° from the XZ plane, said vibrator having a support portion and a vibrator portion having ends, said support portion and said vibrator portion being integral with each other and joined to each other at the ends of said vibrator portion, said vibrator portion having a central section which is substantially wider than the ends thereof and than said support portion, said vibrator having front and back surfaces and an integral film of inert metal on said front surfaces of said vibrator portion and said support portion and a second integral film of inert metal on said back surfaces of said vibrator portion and said support portion for external connection, said vibrator being essentially free of stresses which could cause distortion.

2. The device as defined in claim 1, wherein each of said inert films consists of a layer of chromium and a layer of gold on said layer of chromium and further comprising an electrical lead attached to each of said inert films at said support portion.

3. The device as defined in claim 1, wherein said vibrator is encased in a housing.

4. The device as defined in claim 1, wherein said vibraor has opposed edges which are straight, said edges being those which can vibrate in shear mode.

5. The device as defined in claim 1, wherein said vibrator has opposed edges which are curved, said edges being those which can vibrate in shear mode, the curvature of said edges being such as to minimize the effect of variation in the ambient temperature on the frequency of shear-mode vibration of said curved edges.

6. The device as defined in claim 5, wherein said curved opposed edges have a metal deposit thereon of greater thickness than that over the remainder of said vibrator so that said vibrator vibrates in the trapped energy mode.

* * * * *